United States Patent [19]
Swank, II

[11] Patent Number: 5,949,380
[45] Date of Patent: Sep. 7, 1999

[54] ANTENNA TESTER

[75] Inventor: John D. Swank, II, Hudson, Ohio

[73] Assignee: Bird Electronic Corporation, Solon, Ohio

[21] Appl. No.: 08/926,962

[22] Filed: Sep. 10, 1997

[51] Int. Cl.[6] .................................. H01Q 1/50; G01R 4/08
[52] U.S. Cl. ........................................... 343/703; 343/860
[58] Field of Search ...................... 343/703, 850, 343/852, 860, 701; 333/32; 324/58, 95; H01Q 1/50; G01R 4/08

[56] References Cited

U.S. PATENT DOCUMENTS

| | | | |
|---|---|---|---|
| 2,639,317 | 5/1953 | Bennett | 175/183 |
| 2,832,934 | 4/1958 | Walters | 333/17 |
| 3,031,615 | 4/1962 | Chase et al. | 324/58 |
| 3,784,911 | 1/1974 | Ramstrom | 324/95 |
| 3,829,770 | 8/1974 | Stevens | 324/95 |
| 3,906,411 | 9/1975 | Lind et al. | 333/32 |
| 4,110,685 | 8/1978 | Leenerts | 324/58 B |
| 4,267,599 | 5/1981 | Vissers | 455/115 |
| 4,438,394 | 3/1984 | Ekdahl | 324/126 |
| 4,962,359 | 10/1990 | Dunsmore | 324/638 |
| 5,157,338 | 10/1992 | Motherbaugh et al. | 324/637 |
| 5,408,690 | 4/1995 | Ishikawa et al. | 455/115 |
| 5,507,010 | 4/1996 | Ahonen | 455/67.4 |
| 5,548,820 | 8/1996 | Victorin | 455/67.4 |

Primary Examiner—Hoanganh Le
Attorney, Agent, or Firm—Rankin, Hill, Porter & Clark LLP

[57] ABSTRACT

An antenna tester has a signal generator that produces a test signal applied to the antenna and a reference signal; the test signal and reference signals having a shared noise modulated characteristic; a circuit for detecting a reflected test signal from the antenna in response to the test signal; and a demodulator circuit for demodulating the reflected test signal and reference signal based on the noise characteristic to produce first and second output signals; the first and second output signals having detectable characteristics related to the antenna impedance characteristics.

18 Claims, 1 Drawing Sheet

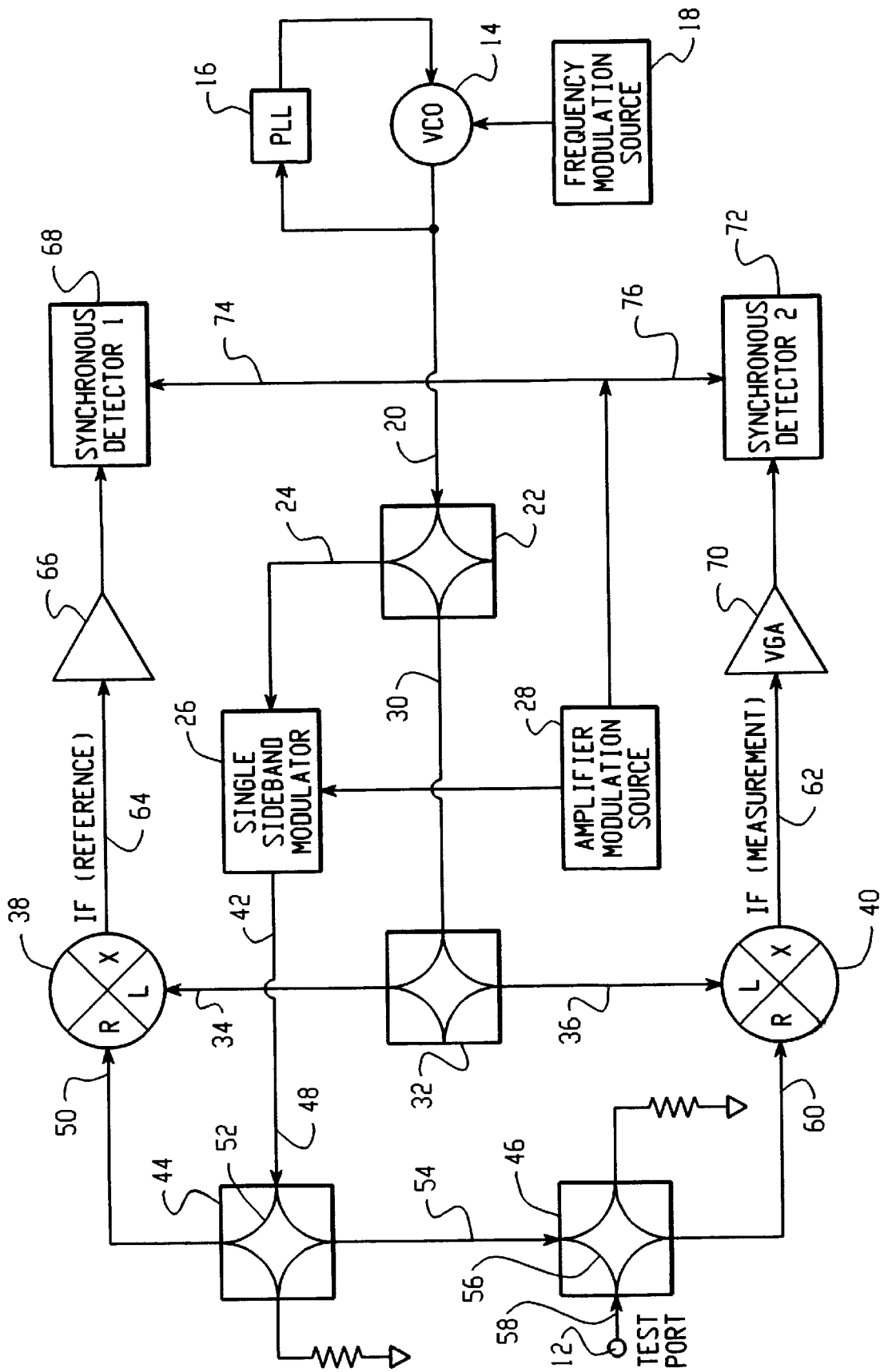

ANTENNA TESTER

BACKGROUND OF THE INVENTION

The invention relates generally to high frequency impedance measurements such as the use of reflectometry for antenna measurements. More particularly, the invention relates to reflectometry techniques utilizing noise modulation to reduce the effects of interfering signals.

Antenna impedance measurement is commonly performed by measurement of the voltage standing wave ratio (VSWR). Measurement of the VSWR, however, is more complicated when the antenna under test is in the presence of strong interfering signals. Such interfering signals can occur, for example, from nearby antennas or other transmission devices in the area of the antenna under test.

The objectives exist, therefore, for providing apparatus and methods for measuring VSWR even in the presence of strong interfering signals at the antenna or antenna test port.

SUMMARY OF THE INVENTION

To the accomplishment of the foregoing objectives, the present invention contemplates an antenna impedance tester that includes a signal generator that produces a test signal applied to the antenna and a reference signal; the test signal and reference signals having a shared noise modulated characteristic; and demodulator means for demodulating the test and reference signals based on the noise characteristic to produce first and second output signals; the first and second output signals having detectable characteristics related to the antenna impedance characteristics.

The invention also contemplates the methods embodied in the use of the aforementioned impedance tester, as well as in another embodiment, a method for determining antenna impedance characteristics, comprising the steps of a) producing a test signal and a reference signal, said test and reference signals having a shared noise modulation characteristic; b) applying said test signal to the antenna and detecting a reflected signal portion of the test signal from the antenna; and c) demodulating said reflected signal and reference signal based on said noise characteristic to produce first and second output signals; said first and second output signals having detectable characteristics related to the antenna impedance characteristics.

These and other aspects and advantages of the present invention will be readily understood and appreciated by those skilled in the art from the following detailed description of the preferred embodiments with the best mode contemplated for practicing the invention in view of the accompanying drawings.

BRIEF DESCRIPTION OF THE DRAWING

The drawing is an electrical schematic diagram of a reflectometer circuit embodying the concepts of the invention.

DETAILED DESCRIPTION OF THE INVENTION

With reference to the drawing, an embodiment of the invention is illustrated in electrical schematic form in the form of a reflectometer, for purposes of describing the basic concepts of the invention. The reflectometer can be realized in digital or analog form, such as by the use of digital signal processing, for example, or conventional analog circuits. In this exemplary configuration, the reflectometer 10 includes a test port or terminal 12. The test port 12 is connected to an antenna (not shown) for purposes of determining or measuring impedance characteristics thereof. The connection of the test port 12 to an antenna can be made by any suitable means such as a coaxial cable, precision connectors or other suitable mechanisms.

A voltage controlled oscillator (VCO) 14 which can be of conventional design operates over a desired frequency range that is compatible with the antenna under test. The VCO 14 is phase locked by a conventional phase lock loop (PLL) circuit 16. The PLL circuit 16 assures a constant phase referenced output for the center carrier frequency.

The VCO 14 output is frequency modulated (FM) using a frequency modulation circuit 18. The frequency modulation circuit 18 can be of conventional design and produce either a true random frequency modulation using a noise source to control the frequency modulation process, or a pseudo-random frequency modulation such as can be effected using "random" number generation for a digital signal processing frequency modulation process Thus, as used herein, the term "random frequency modulation" includes both true random frequency modulation as well as pseudo-random frequency modulation. Those skilled in the art will appreciate that FM modulation is one option available, and that the invention could also be realized by the use of random phase modulation (PM).

The random frequency modulation of the carrier frequency from the VCO 14 is preferably spectrally flat from below the cutoff frequency of the PLL 16 to at least ten times the highest frequency of the amplitude modulated tone signal (to be described hereinafter). Furthermore, frequency deviation is preferably chosen to exceed the spectral width of the communication channel under examination.

The random FM output signal 20 from the VCO 14 is input to a conventional high frequency power splitter 22. The splitter 22 separates the FM output signal 20 into two equal amplitude paths. The first path 24 inputs the random FM signal 20 to a single sideband amplitude modulator (AM) 26. The amplitude modulator modulates the random FM signal using any convenient AM tone, for example 5 kHz, from an amplitude modulation source 28. The second path 30 from the splitter 22 inputs the random FM signal to a second power splitter 32. The second splitter 32 again splits the random FM signal into two equal amplitude mixer reference signals 34 and 36 which are respectively input to a reference mixer 38 and a measurement mixer 40. The mixers 38, 40 can be conventional in design and operation.

The AM modulated output 42 from the single sideband modulator 26 is input to a first of two reflection bridges 44 and 46. Each reflection bridge operates in effect as a directional coupler power splitter. The AM/FM modulated signal is split into two paths by the first bridge 44. The first path 50 is a reference path and is input to the reference mixer 38. This produces a reference signal 52 from the first bridge 44 that is characterized by the AM/FM modulated signal output from the modulator 26. The second path 54 is input to the second bridge 46 which is connected to the antenna test port 12. Thus, the signal split off from the first coupler 44 along the second path 54 functions as a test signal 56 and shares the same AM/FM modulation characteristics as the reference signal 52. The reference and test signals 52, 56 are thus simultaneously modulated with the AM tone signal and the random FM modulation characteristic.

An important aspect of the described embodiment is that the reflection bridges 44, 46 provide good isolation between the test port 12 and the reference mixer 38, or in other words, good isolation of the test and reference signals 52, 54 even though these signals share the same source characteristics. This isolation is necessary to prevent interfering signals at the test port 12 from reaching the reference mixer 38. Interfering signals from the test port 12 should be blocked from the reference mixer input 50 in order to achieve good rejection of the interfering signals. For example, it is preferred that the dual reflection bridge 44, 46 or other suitable isolation devices provide isolation of at least thirty to forty decibels between the test port 12 and the reference mixer 38 input from the bridge 44.

A portion of the test signal 56 is reflected back from the antenna as represented by the directional arrow 58 and is re-directed to an input 60 of the measurement mixer 40. The signal 58 is proportional to the antenna/test port impedance in amplitude and phase, as is known to those skilled in the art. The signal 52 that appears at the reference mixer input 50 has reference amplitude and phase characteristics unaffected by the antenna/test port impedance. The measurement mixer input signal from the test port 12 may also include, however, signal strength from interfering signals, such as for example if the antenna is in an active array area. The illustrated embodiment, in accordance with the invention, operates to eliminate or substantially eliminate these interfering signals.

The mixer 40 combines the reflected signal from the antenna with the mixer reference signal 36. The signal on path 36 has the same random FM characteristics as the test signal applied to the antenna. The output 62 of the measurement mixer 40 is an intermediate frequency (IF) signal having the AM tone signal imposed thereon, which tone carries amplitude and phase characteristics proportional to the antenna/test port impedance. Any stationary signal or other interfering signal that does not have the same random modulation as that applied to the test and reference signals, appear as noise at the output of the measurement mixer 40. Therefore, any interfering signal that appears at the test port 12 or the antenna will be uncorrelated with the random FM characteristic and, regardless of frequency and strength of the interfering signal, in effect will be decorrelated by the measurement mixer 40 operation.

The reference mixer 38 combines the reference signal 52 and the mixer reference signal 34 and produces an output 64 that is a reference IF signal having the same AM tone modulation as the test signal that was applied to the antenna at the test port 12. The reference IF signal 64 is amplified by a fixed gain amplifier 66 and input to a first synchronous detector circuit 68. The amplifier 66 and synchronous detector 68 can be conventional in design and operation.

The measurement mixer IF signal 62 is amplified by a variable gain amplifier 70 and input to a second synchronous detector 72. The amplifier 70 and synchronous detector 72 can be conventional in design and operation. A variable gain amplifier 70 is used in the measurement path due to expected variations in the signal strength, caused by changes in reflection coefficient, returned from the antenna/test port.

The measurement mixer IF signal 62 and reference mixer IF signal 64 thus contain all the information needed to determine the antenna impedance properties. All that is further required is to extract the information by recovering and comparing to each other the AM tone signal from each IF signal. This is accomplished using the two synchronous detectors 68, 72. These detectors 68, 72 can be discrete implementations or part of a digital signal processing operation. In either case, the detectors receive respective control input signals 74, 76 that share the same AM characteristic as the test signal. The synchronous detectors 68, 72 in this embodiment are used to carry out a vector multiplication of the reference and measurement signals and the AM modulated random FM signal to recover the reference AM tone and the reflected AM tone from the antenna. The recovered tones can then be compared in a conventional manner to extract the amplitude and phase characteristics of the test port/antenna impedance. In this example, the ratio of the measurement channel tone signal from the second synchronous detector 72 to the reference channel tone signal from the first synchronous detector 68 is the test port reflection coefficient, which coefficient can be easily converted to the VSWR as is well known in the art. Therefore, any interfering signal, from the test port 12 or antenna, that is uncorrelated with the random FM characteristic of the test signal, will not produce an output from the synchronous detector 72.

The present invention thus provides apparatus and methods for using reflectometry in the presence of strong interfering signals. Interfering signals are eliminated by the use of a random FM characteristic that is simultaneously applied to both a test signal and a reference signal, with isolation between the test port and reference mixer, so that interfering signals from the antenna/test port appear as uncorrelated noise and are filtered out during the demodulation and detection process.

While the invention has been shown and described with respect to specific embodiments thereof, this is for the purpose of illustration rather than limitation, and other variations and modifications of the specific embodiments herein shown and described will be apparent to those skilled in the art within the intended spirit and scope of the invention as set forth in the appended claims.

I claim:

1. An antenna tester comprising: a signal generator that produces a test signal applied to an antenna and a reference signal; said test signal and reference signal having a shared noise modulated characteristic; means for detecting a reflected test signal from the antenna in response to said test signal; and demodulator means for demodulating said reflected test signal and reference signal based on said noise characteristic to produce first and second output signals; said first and second output signals having detectable characteristics related to the antenna impedance characteristics.

2. The apparatus of claim 1 wherein said signal generator comprises a noise signal generator that produces a noise signal, said signal generator modulating a carrier signal with said noise signal to produce said test and reference signals.

3. The apparatus of claim 2 wherein said noise generator comprises a random frequency modulator.

4. The apparatus of claim 2 wherein said noise generator comprises a pseudo-random frequency modulator.

5. The apparatus of claim 2 wherein said signal generator produces a high frequency carrier signal that is modulated with said noise signal; said carrier signal being amplitude modulated to produce said test signal and reference signal.

6. The apparatus of claim 2 wherein said noise generator comprises a random frequency modulator; said signal generator producing a carrier signal that is frequency modulated by said random frequency modulator; said frequency modulated carrier signal being amplitude modulated to produce said test and reference signals.

7. The apparatus of claim 6 wherein said demodulator means produces an intermediate frequency test signal and an intermediate frequency reference signal by mixing said noise modulated carrier signal with said reflected test signal returned from the antenna and said reference signal respectively.

8. The apparatus of claim 7 comprising detector means for producing said first and second output signals by demodulating said intermediate frequency test and reference signals.

9. The apparatus of claim 8 wherein said detector means comprises first and second synchronous detectors each respectively receiving input of said intermediate frequency test signal and intermediate frequency reference signal, said detectors being referenced to said amplitude modulation.

10. The apparatus of claim 6 wherein said amplitude and frequency modulated carrier signal is input to a dual reflection bridge to produce said test signal transmitted through a test port to the antenna and a test port mixer and to produce said reference signal transmitted through a reference channel to a reference mixer, said bridge providing isolation between said test port and reference mixers to reduce leakage of interfering signals into the reference channel.

11. The apparatus of claim 1 wherein said output signal characteristics can be compared in amplitude and phase to determine the antenna impedance characteristics.

12. The apparatus of claim 1 wherein said test and reference signals are random frequency modulated to appear as noise modulated signals, with interfering signals at the antenna and test port that do not share the same noise modulation characteristic as said test and reference signals appear as noise to and are eliminated by said demodulator means.

13. A method for determining antenna impedance characteristics, comprising the steps of:
   a) producing a test signal and a reference signal, said test and reference signals having a shared noise modulation characteristic;
   b) applying said test signal to an antenna and detecting a reflected signal portion of the test signal from the antenna; and
   c) demodulating said reflected signal and reference signal based on said noise characteristic to produce first and second output signals; said first and second output signals having detectable characteristics related to the antenna impedance characteristics.

14. The method of claim 13 comprising the step of producing a noise signal, said noise signal modulating a carrier signal to produce said test and reference signals.

15. The method of claim 14 wherein said noise signal comprises a random frequency modulation.

16. The method of claim 15 wherein said noise signal comprises a pseudo-random frequency modulation.

17. The method of claim 13 comprising the steps of producing a carrier signal that is frequency modulated by a random frequency modulator; said frequency modulated carrier signal being amplitude modulated to produce said test and reference signals.

18. The apparatus of claim 13 wherein said test and reference signals are random frequency modulated to appear as noise modulated signals, with interfering signals at the antenna and test port that do not share the same noise modulation characteristic as said test and reference signals appear as noise to and are eliminated during said demodulation step.

* * * * *